United States Patent [19]

Yoshida

[11] Patent Number: 4,918,507

[45] Date of Patent: Apr. 17, 1990

[54] SEMICONDUCTOR DEVICE

[75] Inventor: Susumu Yoshida, Itami, Japan

[73] Assignee: Mitsubishi Denki Kabushiki Kaisha, Tokyo, Japan

[21] Appl. No.: 186,237

[22] Filed: Apr. 26, 1988

[30] Foreign Application Priority Data

May 8, 1987 [JP] Japan ................................ 62-112915

[51] Int. Cl.$^4$ ........................ H01L 27/14; H01L 31/00
[52] U.S. Cl. ...................................... 357/30; 357/68; 357/56; 357/16
[58] Field of Search ................ 357/30 Q, 30 A, 30 B, 357/30 D, 68, 56, 58, 16, 17; 372/46

[56] References Cited

U.S. PATENT DOCUMENTS

| | | | |
|---|---|---|---|
| 3,686,036 | 8/1972 | Gereth et al. | 357/30 Q X |
| 4,278,473 | 7/1981 | Borden | 136/249 |
| 4,286,278 | 8/1981 | Lorenze, Jr. et al. | 357/30 Q |
| 4,377,904 | 3/1983 | Chapman et al. | 357/24 X |
| 4,525,732 | 6/1985 | Bayraktaroglu | 357/68 M |
| 4,774,205 | 9/1988 | Choi et al. | 357/16 X |

FOREIGN PATENT DOCUMENTS

| | | | |
|---|---|---|---|
| 2334164 | 2/1974 | Fed. Rep. of Germany. | |
| 60-253286 | 12/1985 | Japan | 357/17 |
| 61-212082 | 9/1986 | Japan. | |
| 62-29892 | 6/1987 | Japan. | |

OTHER PUBLICATIONS

U.S. Journal: Crystal Research and Technology, vol. 16, No. 9, 1981, pp. 989–994.
U.S. Journal: Appl. Phys. Lett., vol. 32, 1978, pp. 376–378.
"2×2-cm$^2$ GaAs Space Solar Cells with 21% Conversion Efficiency", IEEE 18th Photovoltaic Specialists Conference, 1985, pp. 300–303.
"Reverse Bias and Assembly Tolerance of Liquid Phase Epitaxy GaAs Cells", 22th Intersociety Energy Conversion Eng. Conf., pp. 64–69.

Primary Examiner—Andrew J. James
Assistant Examiner—Sara W. Crang
Attorney, Agent, or Firm—Oblon, Spivak, McClelland, Maier & Neustadt

[57] ABSTRACT

Semiconductor layers having a p-n junction are formed over the surface of a semiconductor substrate except for a partial surface. On the partial surface of the semiconductor substrate, a region of an electrode to be connected with an external terminal is formed with an insulating film interposed between the same. Bonding connection with the external terminal is performed on the region for connection, to reduce mechanical damage of the semiconductor layers having the p-n junction while improving photoelectric conversion efficiency and reliability of the device.

3 Claims, 3 Drawing Sheets

SEMICONDUCTOR DEVICE

BACKGROUND OF THE INVENTION

1. Field of the Invention

The present invention relates to a semiconductor device which has highly reliable electrode structure.

2. Discussion of Background

FIG. 1 is a sectional view showing a conventional semiconductor device having photoelectric conversion function, such as a solar cell of gallium arsenide (GaAs). As shown in FIG. 1, an n-type gaAs layer 2 and a p type GaAs layer 3 are laminated on the surface of an n-type GaAs substrate 1. A p-n junction 4 is defined between the n-type GaAs layer 2 and the p-type GaAs layer 3. Electrodes 5 are formed on both end portions and a central portion of the p-type GaAs layer 3, to be in ohmic contact with the p-type GaAs layer 3. A number of electrodes 5 are practically used and they may form a comb-type electrode. A p-type AlGaAs layer 6 is formed on a region of the p-type GaAs layer 3 provided with no such electrodes and an antireflection film is formed on the p-type AlGaAs layer 6. The antireflection film 7 is made of a nitride silicon film of 600 to 800 Å in thickness.

Sunlight incident upon the antireflection film 7 is transmitted through the antireflection film and the p-type AlGaAs layer 6 and absorbed mainly in the p-type gaAs layer 3, to generate electron-hole pairs. Electrons, being minority carriers in the p-type gaAs layer 3, are diffused to reach and pass through the p-n junction 4 to thereby generate photoelectromotive voltage and photoelectromotive current, which are drawn out from the electrodes 5 and 8 so that radiant energy (electromagnetic energy) of the light is converted into electric power. This rate is generally called photoelectric conversion efficiency. In order to improve such photoelectric conversion efficiency, the p-type gaAs layer 3 must be minimized in thickness so that the p-n junction 4 is as close as possible to the light receiving surface.

A semiconductor device having photoelectric conversion function of this type may be used in space as a power source for an artificial satellite, and thickness of the layer 3 is preferably reduced in order to avoid damage by radiation. In general, such film thickness is about 0.5 $\mu$m.

In the aforementioned conventional semiconductor device having photoelectrio conversion function, the electrodes 5 are directly formed on the p-type gaAs layer 3 in ohmic connection manner. Therefore, stress is extremely applied to the p-type GaAs layer 3, the n-type GaAs layer 2 and the p-n junction 4 taking important parts in photoelectric conversion, for connecting the electrodes 5 with external lead terminals (not shown) by a process such as welding or thermocompression bonding.

Particularly in the p-type GaAs layer 3 having thin film thickness of 0.5 $\mu$m, open voltage $V_{OC}$, curve factor FF and short-circuit current $I_{SC}$, which are correlated with photoelectric conversion efficiency, are reduced by thermal or mechanical stress for bonding. Consequently, reduction is caused in photoelectric conversion efficiency and reliability of the device.

SUMMARY OF THE INVENTION

The present invention is directed to a semiconductor device having highly reliable electrode structure and a method of manufacturing the same.

In a first aspect, a semiconductor device according to the present invention comprises a semiconductor substrate and lamination formed partially on the surface of the semiconductor substrate. The lamination has at least a first region of a first conductivity type and a second region of a second conductivity type defining a junction in a boundary between the same. The semiconductor device further includes an electrode which is formed to extend on a surface region of the semiconductor substrate not provided with the lamination and electrically connected with either the first or second region in a prescribed region. A region of the electrode provided on the surface of the semiconductor substrate serves as a region to be connected with an external terminal. The semiconductor device further includes an insulating film which is interposed among the lamination, the semiconductor substrate and the electrode in a region other than the said prescribed region to insulate the electrode from the lamination and the semiconductor substrate.

In a second aspect, a semiconductor device according to the present invention comprises a semiconductor substrate of a first conductivity type, a first semiconductor layer of the first conductivity type partially formed on the surface of the semiconductor substrate, a second semiconductor layer of a second conductivity type formed on the first semiconductor layer, an insulating layer formed over a surface region from a surface of the semiconductor substrate not provided with the first semiconductor layer to a part of a surface of the second semiconductor layer, a first electrode formed on the insulating layer and another part of the surface of the second semiconductor layer to be electrically connected with the second semiconductor layer on the said another surface part and a region of the first electrode on the insulating film on the semiconductor substrate serving as a region to be connected with an external terminal, and a second electrode formed on the back surface of the semiconductor substrate.

In a third aspect, a method of manufacturing a semiconductor device according to the present invention comprises the steps of preparing a semiconductor substrate, forming lamination having at least a first region of a first conductivity type and a second region of a second conductivity type which define a junction in a boundary between the same on the surface of the semiconductor substrate, selectively etching the lamination to partially expose the surface of the semiconductor substrate, forming an insulating film over a surface region from the exposed surface part of the semiconductor substrate to a part of the surface of lamination and forming an electrode on the insulating film and another surface part of the lamination to be electrically connected with either the first or second region on the said another part, a region of the electrode on the insulating film on the semiconductor substrate serving as a region to be connected with an external terminal.

In a fourth aspect, a method of manufacturing a semiconductor device according to the present invention comprises the steps of preparing a semiconductor substrate of a first conductivity type forming a first semiconductor layer of a first conductivity type on the surface of the semiconductor substrate of a first conductivity type, forming a second semiconductor layer of a second conductivity type on the first semiconductor layer, selectively etching the first and second semiconductor layers to partially expose the surface of the semiconductor substrate, forming an insulating film over a surface region from the exposed surface of the semiconductor substrate to a part of a surface of the second semiconductor layer, forming a first electrode on the insulating film and another part of the surface of the second semiconductor layer to be electrically connected with the second semiconductor layer on the another part, a region of the first electrode on the insulating film on the semiconductor substrate serving as a region to be connected with an external terminal, and forming a second electrode on a back surface of the semiconductor substrate.

Accordingly, an object of the present invention is to provide a semiconductor device which is adapted to improve photoelectric conversion efficiency and reliability of the developed by reducing mechanical damage of semiconductor layers in bonding with an external lead terminal and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
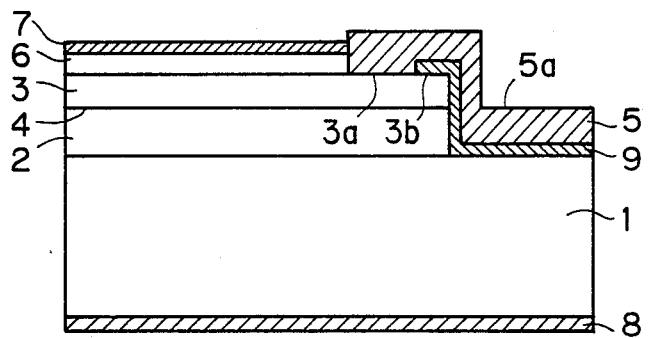
FIG. 2 is a sectional view showing a semiconductor device having photoelectric conversion function according to an embodiment of the present invention.

FIG. 2 is a sectional view showing an embodiment of a semiconductor device having photoelectric conversion junction according to the present invention. As shown in FIG. 2, an n-type GaAs layer and a p-type GaAs layer 3 having a p-n junction 4 are laminated partially on the surface of an n-type GaAs substrate 1. An electrode 5 is formed over a region on the n-type gaAs substrate 1 not provided with the n-type and p-type GaAs layers 2 and 3 and surface parts 3a and 3b of the p-type GaAs layer 3. An insulating film 9 is interposed between the electrode and the n-type GaAs substrate 1, the n-type GaAs layer 2 and the p-type GaAs layer 3 to insulate the electrode 5 from the n-type semiconductor substrate 1, the n-type semiconductor layer 2 and the p-type semiconductor layer 3 except for the surface part 3a of the p-type GaAs layer 3. A p-type AlGaAs layer 6 is formed on a surface region of the p-type gaAa layer 3 not provided with the insulating film 9 and the electrode 5. An antireflection film 7 is provided on the p-type AlGaAs layer 6.

A method of manufacturing the aforementioned semiconductor device is as follows: First, the n-type gaAs layer 2 is formed on the n-type semiconductor substrate 1 by a liquid-phase epitaxial growth or metal organic chemical vapor deposition (MOCVD) process.

Then, the p-type GaAs layer 3 is formed on the n-type GaAs layer 2 by doping zinc through diffusion or MOCVD. Thus, the p-n junction 4 is defined between the p-type GaAs layer 3 and the n-type GaAs layer 2.

Thereafter the p-type GaAs layer 3 is doped with an element of the group II such as zinc, beryllium or magnesium, so that the p-type AlGaAs layer 6 is formed on the p-type GaAs layer 3.

Then the antireflection film 7 of silicon nitride is formed on the surface of the p-type AlGaAs layer 6 through a process such as CVD (chemical vapor deposition).

Thereafter the n type GaAs layer 2, the p-type GaAs layer 3, the p-type AlGaAs layer 6 and the antireflection film 7 are selectively etched to partially expose the surface of the n-type gaAs substrate 1. Further, the p type AlGaAs layer 6 and the antireflection film 7 are selectively etched to expose the surface parts 3a and 3b of the p-type GaAs layer 3.

As shown in FIG. 2, the heatproof insulating film 9 of silicon nitride, silicon oxide or polyimide is formed over the exposed surface of the n-type GaAs substrate 1, the side surfaces of the n-type gaAs layer 2 and the p-type GaAs layer 3 including the p-n junction 4 and the part 3b of the exposed surface of the p-type GaAs layer 3.

Then the electrode 5 is formed on the insulating film 9 and the part 3a of the exposed surface of the p-type gaAs layer 3 to be in ohmic contact with the p-type GaAs layer 3 only on this part 3a. This electrode 5 has a region 5a to be connected with an external lead terminal (not shown) on the insulating film 9 on the n type GaAs substrate 1.

Finally, an electrode 8 is formed on the back surface of the n-type GaAs substrate 1, to thereby complete the semiconductor device having photoelectric conversion function. The antireflection film 7 may be formed after formation of the electrode 5.

Figure 1:
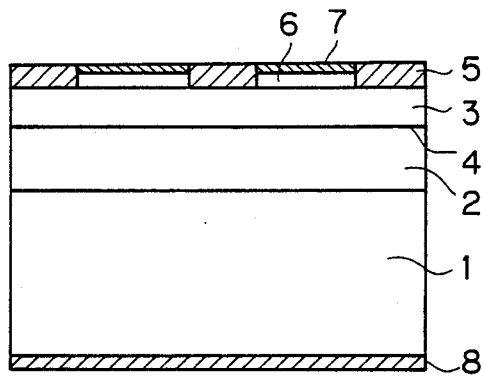
FIG. 1 is a sectional view showing a conventional semiconductor device having photoelectric conversion function.

In the conventional semiconductor device shown in FIG. 1, the p-type GaAs layer 3 and the p-n junction 4 are easily mechanically damaged since the electrodes 5, being in ohmic connection with the p-type GaAs layer 3, are bonded to external lead terminals (not shown) on the p-type GaAs layer 3. In the inventive semiconductor device having photoelectric conversion function manufactured through the aforementioned method, however, the region 5a of the electrode 5 to be bonded with the external lead terminal (not shown) is provided on the insulating film 9 on the n-type GaAs substrate 1.

According to this embodiment, therefore, the electrode 5 is connected with the external lead terminal (not shown) at the region 5a provided on the insulating film 9 on the n-type GaAs substrate 1, to thereby reduce mechanical damage to the p-type GaAs layer 3, the n-type GaAs layer 2 and the p-n junction 4 having photoelectric conversion function. Further, since the electrode 5 is completely insulated from the electrode 8 by the insulating film 9, no problem is caused by partially providing the electrode 5 on the n-type GaAs substrate 1.

Figure 3A:
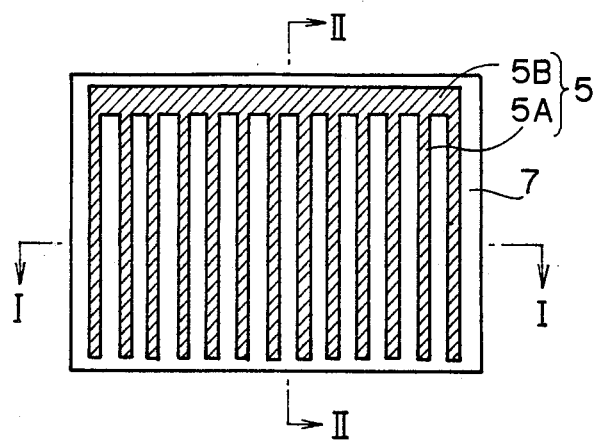
FIG. 3(a) is a plan view showing a semiconductor device having photoelectric conversion function according to another embodiment of the present invention.
Figure 3B:
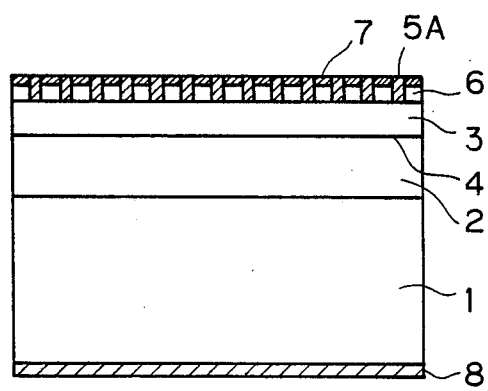
FIG. 3(b) is a cross-sectional view taken along the line I—I of FIG. 3(a)
Figure 3C:
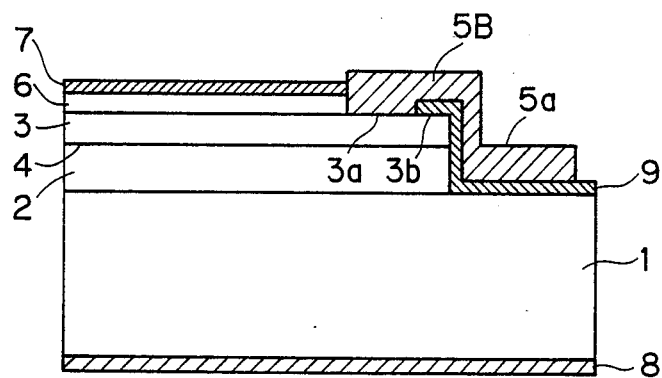
FIG. 3(c) is a cross-sectional view taken along the line II—II of FIG. 3(a).

FIG. 3(a) is a plan view showing a semiconductor device having photoelectric conversion function according to another embodiment of the present invention, and FIG. 3(b) and FIG. 3(c) are cross sectional views taken along the lines I—I and II—II of FIG. 3(a), respectively. The structure illustrated in FIG. 3(c) is substantially the same with that illustrated in FIG. 2 according to the aforementioned embodiment.

Referring to FIGS. 3(a) to 3(c), an electrode 5 consists of a grid electrode 5A, which is formed in comb-type shape to efficiently lead a light to a p-n junction and a bar electrode 5B for connection to a external lead terminal (not shown). In FIG. 3(c), the bar electrode 5B is shown in enlarged manner for convenience of illustration.

The bar electrode 5B has a portion 5a to be connected with the external lead terminal on an insulating film 9 on an n-type GaAs substrate 1, similarly to the electrode 5 shown in FIG. 2, to obtain similar advantages to the embodiment shown in FIG. 2. Further, photoelectromotive voltage and photoelectromotive current can be efficiently collected by the electrode 5, since the comb-type grid electrode 5A is provided on a p-type GaAs layer 3.

Although the above embodiment have been described with reference to a gaAs photoelectric conversion device, the present invention is also applicable to a semiconductor device which has an active layer (e.g., epitaxial layer, diffusion layer and ionimplanted layer) on a semiconductor substrate.

In the semiconductor device according to the present invention as hereinabove described, the region of the electrode to be bonded with the external lead terminal is provided on the insulating film on the semiconductor substrate so that bonding is performed on this bonding region to prevent the n-type semiconductor layer and the p-type semiconductor layer defining the p-n junction from mechanical damage caused by bonding, to thereby improve photoelectric conversion efficiency and reliability of the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type;
   a first semiconductor layer of the first conductivity type formed partially on a surface of said semiconductor substrate;
   a second semiconductor layer of a second conductivity type formed on said first semiconductor layer;
   an insulating film formed over a surface region from a surface of said semiconductor substrate not provided with said first semiconductor layer to a part of a surface of said second semiconductor layer;
   a first electrode formed on said insulating film and another part of the surface of said second semiconductor layer to be electrically connected with said second semiconductor layer on said another part, a region of said first electrode on said insulating film on said semiconductor substrate serving as a region to be bonded with an external terminal, said first electrode being a comb-type electrode structure having grid electrode extensions formed on said second semiconductor layer and said first electrode further including a bar electrode section formed on both said second semiconductor layer and said insulating film; and
   a second electrode formed on a back surface of said semiconductor substrate.

2. A semiconductor device in accordance with claim 1, wherein
   said first conductivity type is n-type and said second conductivity type is p-type.

3. A semiconductor device in accordance with claim 1, wherein
   said semiconductor substrate, said first semiconductor layer and said second semiconductor layer are prepared by GaAs,
   said semiconductor device having photoelectric conversion function.

* * * * *